United States Patent
Chen et al.

[19]

[11] Patent Number: 6,080,665
[45] Date of Patent: *Jun. 27, 2000

[54] INTEGRATED NITROGEN-TREATED TITANIUM LAYER TO PREVENT INTERACTION OF TITANIUM AND ALUMINUM

[75] Inventors: Liang-Yuh Chen, San Jose; Ted Guo, Palo Alto; Roderick Craig Mosely, Pheasanton, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/840,209

[22] Filed: Apr. 11, 1997

[51] Int. Cl.$^7$ ..................................................... H01L 21/44
[52] U.S. Cl. .......................... 438/653; 438/680; 438/688; 438/652; 438/644; 438/642; 438/629; 427/455; 427/456; 427/96; 427/99
[58] Field of Search ..................................... 427/455, 456, 427/96, 99; 438/653, 680, 688, 652, 644, 642, 629

[56] References Cited

U.S. PATENT DOCUMENTS

| | | | |
|---|---|---|---|
| 4,715,937 | 12/1987 | Moslehi et al. | 204/177 |
| 4,762,728 | 8/1988 | Keyser et al. | 427/28 |
| 4,782,380 | 11/1988 | Shankar et al. | 357/71 |
| 4,786,360 | 11/1988 | Cote et al. | 156/643 |
| 5,162,262 | 11/1992 | Ajika et al. | 437/200 |
| 5,229,318 | 7/1993 | Straboni et al. | 437/69 |
| 5,236,868 | 8/1993 | Nulman | 437/190 |
| 5,300,455 | 4/1994 | Vuillermoz et al. | 437/190 |
| 5,360,996 | 11/1994 | Nulman et al. | 257/767 |
| 5,403,779 | 4/1995 | Joshi et al. | 437/185 |
| 5,478,780 | 12/1995 | Koerner et al. | 437/190 |
| 5,593,511 | 1/1997 | Foster et al. | 148/238 |
| 5,607,776 | 3/1997 | Mueller et al. | 428/472 |

FOREIGN PATENT DOCUMENTS

| | | |
|---|---|---|
| 0 655 780 A1 | 11/1994 | European Pat. Off. . |
| 08022967 | 1/1996 | Japan . |
| 08186075 | 7/1996 | Japan . |

OTHER PUBLICATIONS

Wolf, Silicon Processing for the VLSI Era:vol. 2—Process Integration, Lattice Press, pp. 128 & 195, 1990.

Shigeru Murakami, Hiroyuki Nakamura and Osamu Kudoh, NEC Corporation, "Plasma–Nitridated Ti Contact System for VLSI Interconnections" Jun. 15–16, 1987, pp. 148–154.

Partial European Search Report for EP 98 30 2795 mailed to Applied Materials, Inc., Sep. 10, 1998.

*Primary Examiner*—John F. Niebling
*Assistant Examiner*—David A. Zarneke
*Attorney, Agent, or Firm*—Thomason Moser & Patterson

[57] ABSTRACT

The present invention generally provides a method for processing a substrate having exposed surfaces of titanium and/or silicon prior to deposition of aluminum. The substrate is positioned adjacent a process zone which provides a nitrogen plasma so that exposed areas of titanium and silicon on the substrate are stuffed with nitrogen to form titanium nitride (TiN) and various compounds of silicon and nitrogen ($Si_xN_y$), respectively. The nitrogen treated surfaces, i.e, TiN and silicon/nitrogen compounds, are resistant to interaction with aluminum. In this manner, the formation of electrically insulating $TiAl_3$ and/or the spiking of silicon is reduced or eliminated.

28 Claims, 5 Drawing Sheets

INTEGRATED NITROGEN-TREATED TITANIUM LAYER TO PREVENT INTERACTION OF TITANIUM AND ALUMINUM

FIELD OF THE INVENTION

The present invention relates to a metallization process for manufacturing semiconductor devices. More particularly, the invention relates to an integrated sequence for sub-quarter micron Al interconnects without $TiAl_x$ formation. More particularly still, the invention relates to a method for treating a substrate with nitrogen to prevent interaction of aluminum with titanium and silicon layers within semiconductor devices.

BACKGROUND OF THE INVENTION

Sub-half micron multilevel metallization is a very important technology for the next generation of very large scale integration ("VLSI"). The multilevel features, including contacts, vias, lines and the like, that lie at the heart of VLSI technology must be reliably formed at increasing circuit densities. One means for increasing circuit density is to decrease the dimensions of the metal conductors that make up the integrated circuit. As the dimensions are made smaller, the operating speed increases and the power density remains constant, but the current density is increased in proportion to the scale-down factor. Therefore, as feature sizes decrease, it is increasingly important that the metal features have high electrical conductivity.

The electrical conductivity of metal features in an integrated circuit can be effected by a number of phenomena, depending upon the design of the circuit and the fabrication techniques used. For example, electromigration is a diffusive process in which the atoms of a solid move from one place to another under the influence of electrical forces. This effect limits the maximum current that can be carried by a conductor without its rapid destruction. For aluminum conductors of integrated circuits, the current density should be kept lower than about $10^6$ A/cm2. While electromigration does not limit the minimum device size, it limits the number of circuit functions that can be carried out by a given number of connected circuit elements per unit time. However, conductors with highly oriented crystalline structures exhibit enhanced resistance to electromigration. Therefore, as geometries of integrated circuits are reduced, the need for highly oriented films increases. Ideally, an aluminum film layer having a <111> crystal orientation is formed on the substrate to improve the electromigration resistance of the film at these small geometries. Typically, a Ti underlayer is used to improve the <111> crystal orientation of Al.

Another phenomena that effects electrical conductivity of metals is the formation of an electrically resistive layer of $TiAl_3$ caused by the interaction of titanium (Ti) and aluminum (Al) layers. $TiAl_3$ is believed to increase electrical resistance, especially in smaller feature sizes, such as sub quarter micron vias. The formation of $TiAl_3$ is also believed to be disadvantageous for stress migration and etching of the film. However, both titanium and aluminum are conductive metals that are commonly used in the formation of conductive metal devices within integrated circuits. The unique physical properties of both titanium and aluminum are beneficially used in various combinations to produce devices that are superior to those made without the combination. Therefore, it is most beneficial to find ways to minimize or prevent their interaction.

Titanium is known to be useful as a "glue" layer between a silicon or silicon dioxide layer and conductive metal layers such as aluminum. As the term "glue" layer implies, the titanium adheres to the silicon better than many other conductive metals, such as aluminum, and also forms a strong bond with adjacent conductive metals.

Aluminum is known to be useful for forming conductive metal lines and features throughout an integrated circuit due to its high electrical conductivity and good processability. Aluminum may be deposited by various techniques including both physical vapor deposition (PVD) and chemical vapor deposition (CVD). However, aluminum is also known to invade the structure of silicon which may cause device failure, and it can experience electromigration at high current densities. Aluminum spiking is minimized by the use of a continuous barrier layer, such as Ti or TiN, between aluminum and silicon layers. The electromigration resistance of aluminum is increased by forming highly crystalline structures and/or providing an aluminum/copper alloy. Aluminum/copper alloys may be formed by depositing copper along with the aluminum, i.e., PVD Al/Cu, or doping an aluminum by subsequent deposition and diffusion of copper therein.

Ti is commonly used as a wetting layer to enable the flow of a PVD deposited Al film into vias, trenches, etc. However, $TiAl_3$ formation increases the line and via resistance. One method for minimizing or preventing formation of electrically resistive $TiAl_3$ is to separate titanium and aluminum layers with a layer of titanium nitride (TiN). The benefit of the TiN layer is that it provides good bonding between titanium and aluminum, yet does not interact with the aluminum. However, TiN tends to be flaky and adhere loosely to the chamber walls and can become a particle source within the chamber.

Although a deposition sequence of Ti/TiN/Al has been shown to reduce the formation of $TiAl_3$, the sequence requires that the TiN layer cover the entire Ti layer in order to prevent any interaction with Al. Unfortunately, the inclusion of an additional, continuous layer in the metallization stack decreases the feature size. In order to keep from increasing the thickness of the metallization stack too drastically, it is common to use a layer of TiN that is very thin and may be less than continuous. When only an ultra-thin or subatomic layer of Ti is being used to nucleate CVD Al, the TiN layer must cover all the Ti to prevent $TiAl_3$ formation and all of the Si must be covered by Ti or TiN to prevent aluminum migration/invasion into the silicon.

An additional limitation of both Ti and TiN layers is that they are conventionally deposited by PVD processes. While conventional PVD techniques are relatively inexpensive and can provide conformal coverage over a field (the upper or outer most surface of the wafer), these same techniques are not well suited for covering the wall and floor surfaces of high aspect ratio vias and other features. Consequently, a TiN layer that is continuous over the field may not be continuous within the via. A discontinuous TiN layer on a via floor is particularly troublesome, because it allows Ti and Al to interact and form electrically insulating $TiAl_3$ across the face of contact between the metal plug and the feature.

Furthermore, even after depositing PVD Ti/TiN in the via, the via may still have areas of exposed silicon in the case of silicon contacts, particularly along the base of the via sidewalls and the perimeter edge of the via floor. The poor coverage of silicon in the via may be made worse if the via was over-etched to have an irregular or downwardly widening profile. Subsequently depositing aluminum directly on the exposed silicon will allow aluminum migration into the silicon.

It is known that the barrier properties of TiN can be enhanced by annealing or incorporating oxygen into the film. The oxygen fills the spaces between the grain boundaries of the TiN. Annealing can be carried out in a rapid thermal anneal (RTA) chamber, or by heating in an oxygen atmosphere. Oxygen treatment of TiN reduces the likelihood of spiking by providing a good barrier layer for Al.

Therefore, there is a need for a process that will prevent the interaction of aluminum with titanium and silicon. It would be desirable if the process could be performed in a conventional processing chamber, require fewer processing steps and reduce processing times. It would also be desirable if the process could reduce the thickness of a metallization stack while preventing the formation of TiAl3. It would be even further desirable if the process reduced the amount of particle generation.

SUMMARY OF THE INVENTION

The present invention provides a method of forming titanium nitride on a substrate, comprising the steps of depositing titanium on the substrate and exposing the titanium to a nitrogen plasma ($N_2$). These steps may be repeated as desired. The titanium may be deposited by chemical vapor deposition (CVD) or physical vapor deposition (PVD), including standard and collimated PVD as well as high density plasma PVD (known as ion metal plasma). Nitrogen is provided into a process zone adjacent the substrate at a rate between about 5 sccm and about 500 sccm, preferably at about 300 sccm. The titanium may also be exposed to a nitrogen plasma provided by capacitively or inductively coupling energy into a process zone adjacent the substrate in the presence of nitrogen. The titanium nitride may form a nucleation layer or a subatomic layer that may be either discontinuous or continuous.

Another aspect of the invention provides a method of processing a substrate, comprising the steps of depositing titanium on the substrate, contacting the titanium with nitrogen to form titanium nitride, and depositing aluminum on the titanium nitride. The aluminum may be deposited by either CVD or PVD. The aluminum is then heated to a temperature between about 350 C. and about 600 C. Typically, the aluminum is annealed at a temperature between about 400 C. and about 500 C. This process provides the annealed aluminum with a sheet resistivity of less than about 3-0 $\mu\Omega s9$.

Yet another aspect of the invention provides a method of processing a substrate. The method comprises the steps of depositing titanium on a substrate, contacting the titanium with nitrogen to form titanium nitride, depositing a first layer of aluminum on the titanium nitride, and depositing a second layer of PVD warm aluminum over the first layer of aluminum. The method may further include depositing titanium nitride on the aluminum.

A further aspect of the invention provides a method of processing a substrate having a silicon surface in which the silicon is exposed to a nitrogen plasma at a pressure between about 0.5 mTorr and about 5 Torr, preferably about 1.5 Torr. The method may include depositing titanium on the substrate, contacting the titanium with nitrogen to form titanium nitride, and, optionally, depositing a first layer of aluminum on the titanium nitride, and depositing a second layer of PVD warm aluminum (i.e., Al deposited at a substrate temperature $\leq 380°$ C.) over the first layer of aluminum.

In an additional aspect of the invention, a substrate having exposed titanium and silicon is processed by providing nitrogen to a process zone adjacent the substrate at a pressure between about 0.5 and about 5 Torr, striking a plasma in the process zone, converting exposed titanium to titanium nitride, and converting exposed silicon to silicon nitride.

BRIEF DESCRIPTION OF THE DRAWINGS

So that the manner in which the above recited features and advantages of the present invention can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefor not to be considered limiting of its scope, for the invention may admit to other equally effective embodiments.

DETAILED DESCRIPTION OF THE INVENTION

The present invention generally provides a method for processing a substrate having exposed surfaces of titanium and/or silicon prior to deposition of aluminum thereon. The substrate is positioned adjacent a process zone which provides a nitrogen plasma so that exposed areas of titanium and silicon on the substrate are exposed to ("stuffed with") nitrogen to form titanium nitride (TiN) and various compounds of silicon and nitrogen ($Si_xN_y$), respectively. The nitrogen treated surfaces, i.e, TiN and silicon/nitrogen compounds, are resistant to interaction with aluminum. In this manner, the formation of electrically insulating $TiAl_3$ and/or the spiking of silicon is reduced or eliminated.

In one aspect of the invention, a method is provided for nitrogen stuffing titanium to form titanium nitride. The process is beneficial for reducing or preventing the interaction of titanium and aluminum which causes the formation of electrically insulating $TiAl_3$. Both continuous and discontinuous titanium layers may be processed in accordance with the invention by exposure to a nitrogen plasma. Nitrogen ions in the plasma bombard and react with the titanium to form titanium nitride. The titanium nitride is resistant to interaction with aluminum and can provide the $Ti/N_2$ stuffing/Al metallization stack with a sheet resistance that is lower than a Ti/Al stack or a Ti/TiN/Al stack.

In another aspect of the invention, a method is provided for forming a nucleation layer to nucleate deposition of a CVD metal, such as CVD Al. Deposition of a monolayer (i.e., a very thin, preferably conformal layer) or subatomic layer (i.e., less than a continuous layer), of Ti or TiN has been found to nucleate CVD Al and cause the Al deposited thereon to have a highly crystalline structure that exhibits increased resistance to electromigration. In accordance with the invention, a thin layer of TiN can be formed by depositing an thin layer of PVD Ti and exposing the Ti to a nitrogen plasma.

The $N_2$ stuffing of titanium is carried out by first depositing a thin titanium layer, preferably having a thickness between about 50 Å and about 500 Å. The titanium is preferably deposited by sputtering a titanium target in an argon (Ar) sputtering gas for between about 5 and about 30 seconds. $N_2$ is then introduced into the chamber, if not already present during sputtering, and a plasma is struck in the chamber to facilitate a reaction between the Ti and the $N_2$. While a plasma is the preferred method of stuffing, $N_2$ may be provided over the Ti and a different reaction, such as a thermal reaction, may facilitate the reaction between the Ti and the $N_2$. Where a plasma is used, $N_2$ is preferably provided into the chamber at a rate between about 5 sccm and about 500 sccm while the chamber is maintained at a pressure between about 0.5 mTorr and about 5 Torr. Power is either capacitively or inductively coupled into the chamber to excite the $N_2$ into excited neutrals and the like which react with the Ti on the wafer. The wafer temperature is preferably maintained in a range from about room temperature to about 500° C. It should be recognized that the preferred conditions for $N_2$ stuffing of silicon are the same as those for $N_2$ stuffing titanium except that titanium does not need to be present.

The present invention provides the following advantages. First, the formation of $TiAl_3$ is minimized or completely eliminated by reacting all the exposed surfaces of Ti to form TiN. Even if portions of the Ti remain, the use of an ultra-thin Ti nucleation layer reduces the amount of Ti available to react with a metal, such as Al, thereby reducing the formation of $TiAl_3$. Secondly, using PVD Ti, PVD TiN, or PVD Ti/$N_2$-stuffing to provide the nucleation layer eliminates the use of CVD chambers for depositing the nucleation layer for CVD Al. PVD techniques for thin film deposition may be preferable because the resulting film is typically higher in purity than other films and PVD techniques are less costly. Thirdly, the process of the present invention is extendable to very small feature sizes partly because a conformal or continuous nucleation is not needed to nucleate deposition of the wetting layer, especially if high density plasma deposition of Ti or TiN is used to deposit the nucleation layer.

The present invention may be used to advantage in a warm Al planarization process following the sequence Ti/$N_2$-stuffing/CVD Al/warm PVD Al. In this metallization stack, a continuous wetting layer is the key to achieving good conformal coverage. The continuous wetting layer of a CVD metal, such as CVD Al, grows on a thin layer of TiN. The nucleation layer does not have to be a continuous film inside the via to nucleate CVD deposition, thereby providing a wider range of film thicknesses to be used and extending the capability of CVD/PVD integration technology. The inventors have earlier discovered that a thin continuous metal film, such as CVD Al, is a good wetting layer. A wetting layer, comprised of a metal such as Al, aides the filling or flow process used in PVD metal deposition resulting in a low temperature ($\leq 380°$ C.) deposition process as disclosed in co-pending U.S. patent application Ser. No. 08/561,605.

Figure 1:
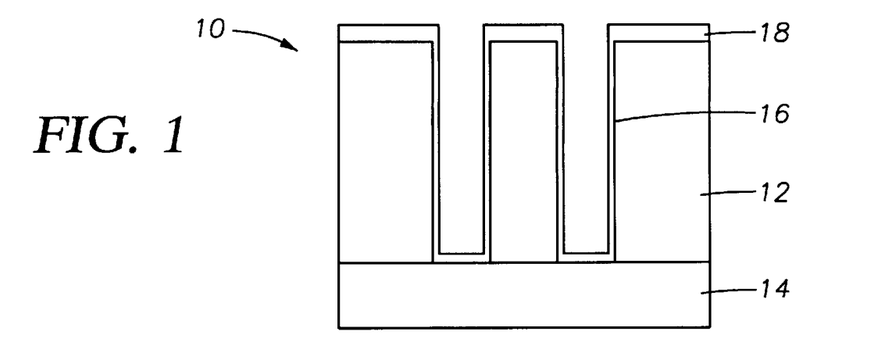
FIG. 1 is a schematic partial sectional view of a substrate processed according to the present invention showing a thin nucleation layer deposited on the substrate.

FIG. 1 shows a partial cross sectional view of a processed substrate 10 having a dielectric layer 12, such as $SiO_2$, deposited over a metal layer 14. In accordance with one aspect of the present invention, the dielectric layer 12 is patterned to include a via 16 therethrough. A thin nucleation film 18 is subsequently deposited on the field of the dielectric layer 12 and inside the via 16. A preferred nucleation layer 18 is provided by PVD Ti that has been nitrogen stuffed to form TiN. Contrary to conventional wisdom, this layer does not have to be continuous and can be deposited using PVD techniques to improve film quality with minimum thickness. The preferred nucleation layer sequence comprises anywhere from a monolayer up to about 200 Å of PVD Ti, following by nitrogen stuffing.

The ultra thin nucleation layer may be deposited on the substrate using techniques described in co-pending and commonly assigned U.S. patent application Ser. No. 08/622,941, which is incorporated herein by reference, to provide controlled deposition of the metal wetting layer on the field and to provide improved morphology and texture of the deposited metal layer, including the subsequent PVD metal layer.

Figure 2:
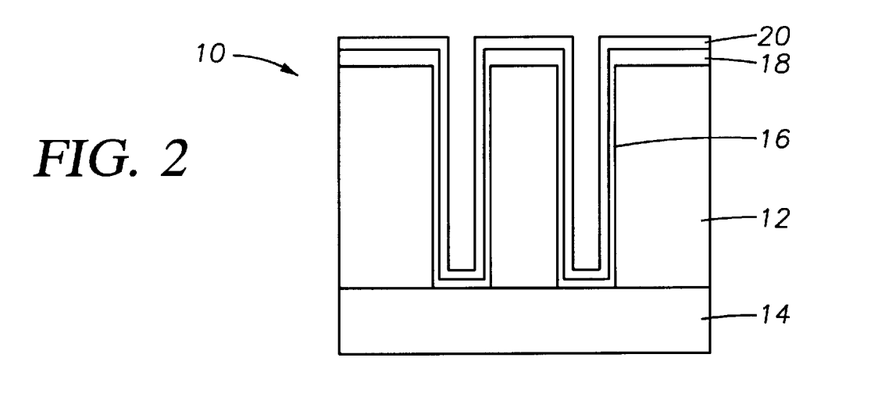
FIG. 2 is a schematic partial sectional view of the substrate of FIG. 1 showing a conformal wetting layer deposited on the substrate.

FIG. 2 is a schematic partial sectional view of the substrate 10 of FIG. 1 showing a thin wetting layer 20, such as a CVD Al layer, deposited on the field and in the via. CVD Al has been found to provide good bottom coverage and continuous step coverage in small apertures with high aspect ratios. The CVD Al layer 28 is preferably deposited on the nucleation layer using thermal decomposition of DMAH as the precursor gas. Preferably about 100 Å to about 300 Å of CVD Al is deposited conformally over the patterned surface to provide a continuous wetting layer 28 for subsequent via fill.

The preferred reaction for deposition of the CVD metal layer is the thermal reduction of DMAH according to the following equation:

$$6(CH_3)_2Al \rightarrow 2Al + 4(CH_3)_3Al + 3H_2$$

While Al is one preferred CVD metal layer, other metals such as copper (Cu) and the like may also be deposited in accordance with the methods of the present invention.

Figure 3:
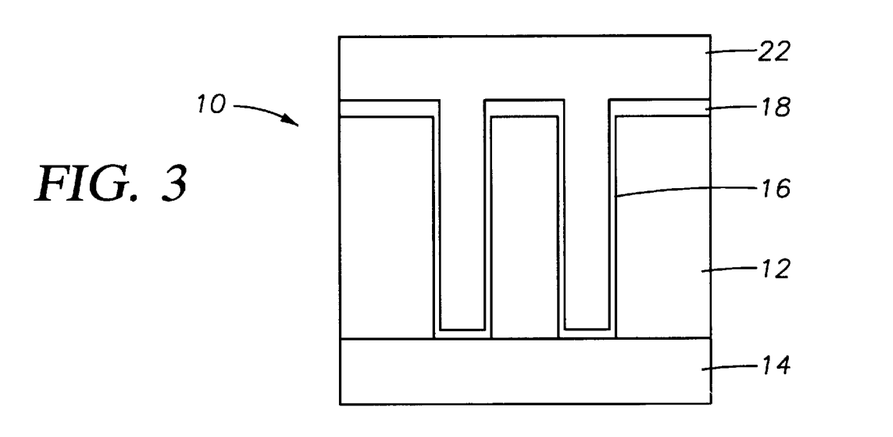
FIG. 3 is a schematic partial sectional view of the substrate of FIG. 2 showing a metal deposited at low temperature on the conformal wetting layer.

FIG. 3 is a schematic partial sectional view of the substrate 10 of FIG. 2 showing a metal layer 22 deposited at low temperature on the conformal wetting layer 20 (See FIG. 2). The via 16 is then preferably filled using PVD techniques, such as deposition of a warm PVD metal layer 22, to provide a void-free, low resistivity interconnect. Preferably, the PVD technique is warm metal deposition which also provides planarization on the field of the structure.

The planarized metal PVD layer 22 is preferably formed at a process temperature greater than about 150° C., most preferably greater than about 250° C., but less than about 380° C. To achieve the planarization of the metal film, it is preferred that the PVD metal film be deposited immediately following deposition of the wetting CVD metal film. The grain growth of the PVD metal layer formed at temperatures greater than about 250° C. absorbs the nodules or other defects that are formed on the field of the substrate during CVD metal deposition to form a highly oriented metal blanket layer. The PVD process is performed by heating the substrate to a temperature below about 660° C., preferably below about 400° C.

It is also preferred that the PVD metal layer include at least trace amounts of copper (Cu) or other dopant material. This can be accomplished by using an AlCu target to deposit a PVD AlCu layer on the CVD wetting metal layer or subsequently over the PVD metal layer. When the PVD AlCu sequentially follows CVD Al or PVD Al in an integrated process having PVD and CVD chambers linked together, via a robot and vacuum capable buffer chamber, an oxide layer will not form when the wafer is passed between chambers and the PVD AlCu layer may grow epitaxially on the CVD Al layer without grain boundaries, i.e., a uniform crystal structure will be formed throughout both layers. Furthermore, the sequential CVD Al/PVD AlCu process allows the intermixed layer to be annealed at about 300° C. for about 15 minutes to achieve substantially uniform distribution of Cu in the CVD/PVD layers. It is also preferred that the top surface of the intermixed CVD/PVD Al layer receive a PVD TiN anti-reflection coating ("ARC") for reducing the reflectivity of the surface and improving the photolithographic performance of the layer.

In a further aspect of the invention, $N_2$-stuffed Ti may be used to form a titanium nitride wetting layer. In this sequence, the Ti layer is preferably conformal. One particularly preferred wetting layer is provided by repeating the sequence PVD Ti/$N_2$-stuffing several times. The TiN wetting layer will not form $TiAl_3$ inside the via. The Ti can be deposited by CVD or PVD techniques.

EXAMPLE

An experiment was undertaken to determine the sheet resistance due to $TiAl_3$ formation in four different metallization processes. Four substrates were obtained and processed under identical conditions except for the metallization sequence. The PVD aluminum deposition temperature was about 170° C. and the PVD titanium deposition temperature was about 250° C. Nitrogen stuffing was performed at a substrate temperature of about 350° C., a pressure of about 1 Torr, and a capacitively coupled plasma operating at a power of about 700 W.

A first substrate received about 500 Å Ti and about 1000 Å Al to illustrate the reduced sheet resistance caused by the formation of TiAl3. A second substrate received about 500 Å Ti, about one minute under nitrogen stuffing conditions, then about 1000 Å Al. A third substrate received about 500 Å Ti, about three minutes under nitrogen stuffing conditions, then about 1000 Å Al. Finally, a fourth substrate received about 500 Å Ti, about 200A PVD TiN, then about 1000 Å Al to illustrate the conventional technique of depositing a TiN layer between the Ti and Al layers. Following deposition of the metallization stack, each wafer was annealed at a temperature of about 450° C. for a period of about 30 minutes.

The sheet resistance of each metallization stack was measured before and after the anneal to highlight the change in resistance due to $TiAl_3$ formation. The results of these measurements are provided in Table 1 below:

TABLE 1

| Process | Sheet ($\Omega$/sq) | | |
|---|---|---|---|
| | Before Anneal | After Anneal | $\Delta$ |
| Ti(500-Å)/Al(1000-Å) | 0.29116 | 0.39335 | 0.10219 |
| Ti(500-Å)/1 × $N_2$ stuffed/Al(1000-Å) | 0.28352 | 0.31135 | 0.02783 |
| Ti(500-Å)/3 × $N_2$ stuffed/Al(1000-Å) | 0.28451 | 0.30982 | 0.02531 |
| Ti(500-Å)/P—TiN(200-Å)/Al(1000-Å) | 0.30117 | 0.33489 | 0.03372 |

The data shows that both nitrogen stuffing processes were effective in reducing the formation of $TiAl_3$, since the sheet resistance, both before and after annealing, was lower than that of the Ti/Al stack. Therefore, the nitrogen stuffing processes may be substituted for a PVD TiN step, thereby providing the following advantages: (1) reduced wafer handling; (2) no TiN particle generation; (3) a thinner metallization stack; and (4) CVD Al deposited on $N_2$ stuffed Ti also exhibits better reflectivity than Al deposited on PVD or CVD TiN films. A further benefit of the nitrogen stuffing process is that any exposed silicon surfaces will be stuffed simultaneously and be protected from aluminum spiking.

The Apparatus

Figure 4:
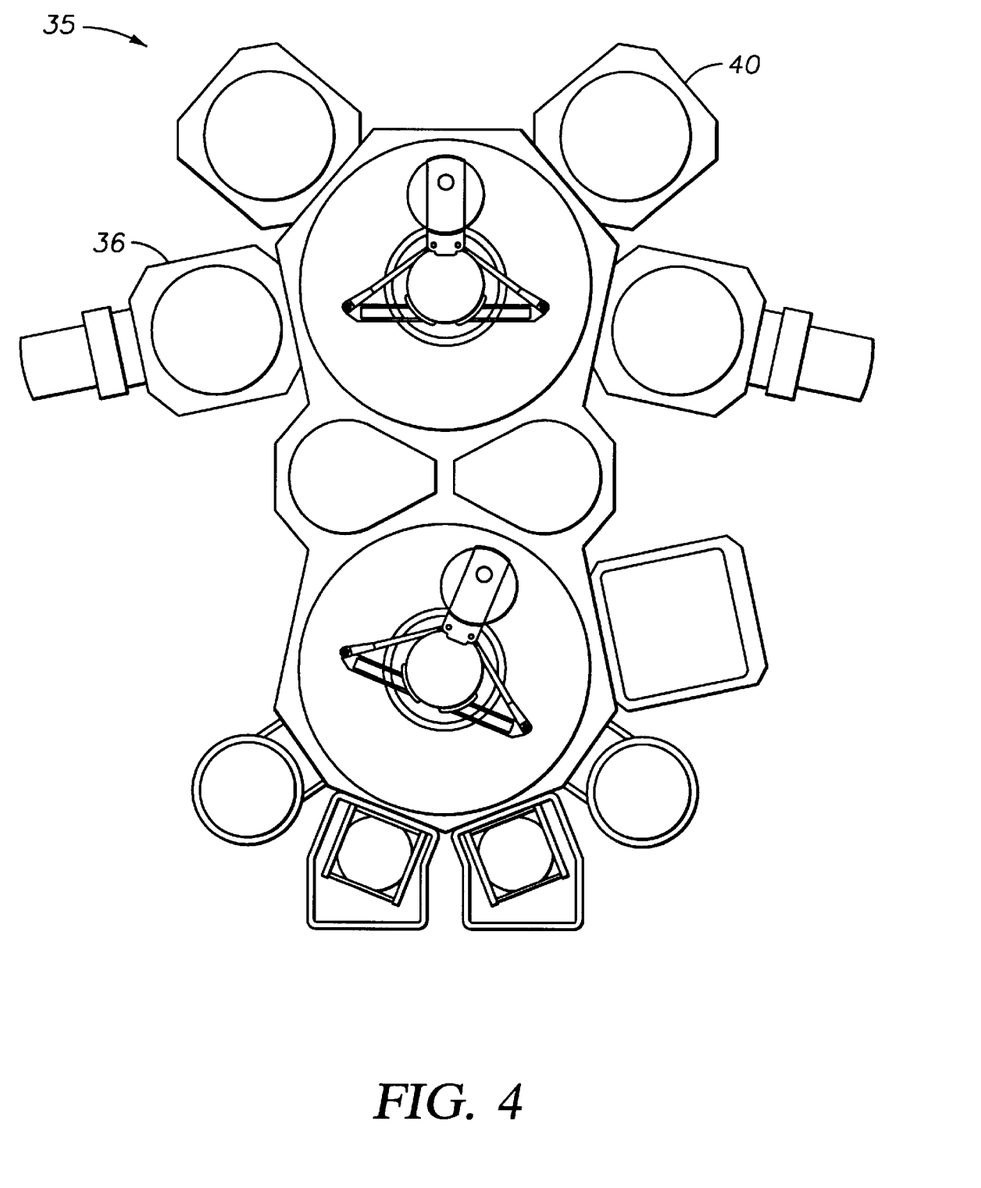
FIG. 4 is a schematic partial sectional view of an integrated multi-chamber apparatus suitable for performing CVD and PVD processes on a substrate.

A schematic of a multichamber processing apparatus 35 suitable for performing the CVD process of the present invention is illustrated in FIG. 4. The apparatus is an "ENDURA" system commercially available from Applied Materials, Santa Clara, Calif. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers, for example, a CVD chamber 40, a PVD chamber 36 and rapid thermal annealing chambers.

The apparatus 35 includes at least one enclosed PVD deposition chamber 36 for performing PVD processes, such as sputtering. The PVD chamber 36 comprises a sputtering target (not shown) of sputtering material facing the substrate. The target is electrically isolated from the chamber and serves as a process electrode for generating a sputtering plasma. During the sputtering process, a sputtering gas, such as argon or xenon, is introduced into the chamber 36. An RF bias current is applied to the sputtering target, and the support supporting the substrate in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from about 100 to 10,000 Watts, to the sputtering target.

Figure 5:
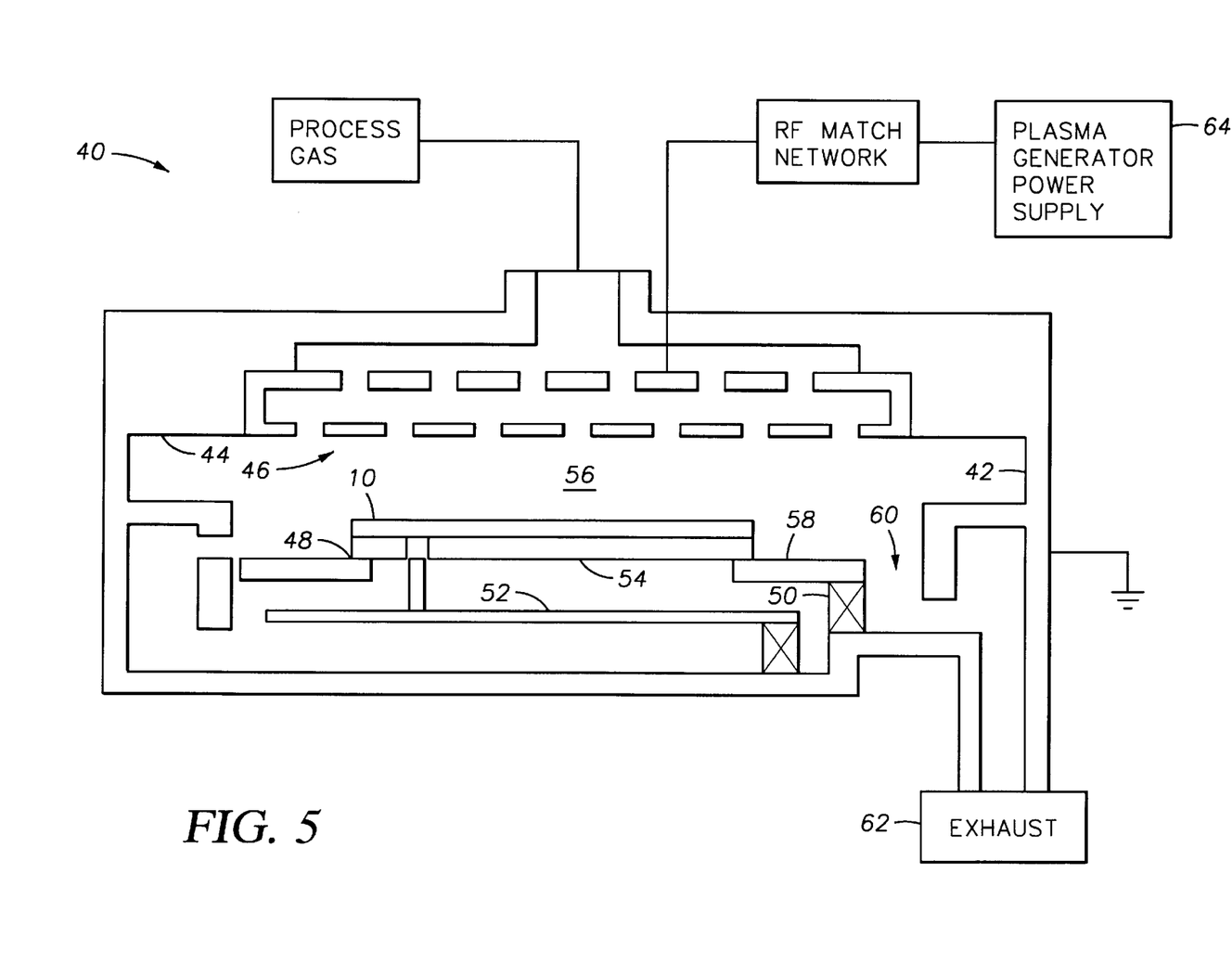
FIG. 5 is a schematic partial sectional view of a CVD chamber suitable for performing the CVD deposition processes of the present invention.

FIG. 5 is a schematic partial sectional view of the CVD deposition chamber 40 suitable for performing a CVD deposition processes of the present invention. The CVD deposition chamber 40 has surrounding sidewalls 42 and a ceiling 44. The chamber 40 comprises a process gas distributor 46 for distributing delivering process gases into the chamber. Mass flow controllers and air operated valves are used to control the flow of process gases into the deposition chamber 40. The gas distributor 46 is typically mounted above the substrate 10 or peripherally about the substrate 10. A support member 48 is provided for supporting the substrate in the deposition chamber 40. The substrate is introduced into the chamber 40 through a substrate loading inlet in the sidewall 42 of the chamber 40 and placed on the support 48. The support 48 can be lifted or lowered by support lift bellows 50 so that the gap between the substrate and gas distributor 46 can be adjusted. A lift finger assembly 52 comprising lift fingers that are inserted through holes in the support 48 can be used to lift and lower the substrate onto the support to facilitate transport of the substrate into and out of the chamber 40. A thermal heater 54 is then provided in the chamber to rapidly heat the substrate. Rapid heating and cooling of the substrate is preferred to increase processing throughput, and to allow rapid cycling between successive processes operated at different temperatures within the same chamber. The temperature of the substrate 10 is generally estimated from the temperature of the support 48.

The substrate is processed in a process zone 56 above a horizontal perforated barrier plate 58. The barrier plate 58 has exhaust holes 60 which are in fluid communication with an exhaust system 62 for exhausting spent process gases from the chamber 40. A typical exhaust system 62 comprises a rotary vane vacuum pump (not shown) capable of achieving a minimum vacuum of about 10 mTorr, and optionally a scrubber system for scrubbing byproduct gases. The pressure in the chamber 40 is sensed at the side of the substrate and is controlled by adjusting a throttle valve in the exhaust system 62.

A plasma generator 64 is provided for generating a plasma in the process zone 95 of the chamber 40 for plasma enhanced chemical vapor deposition processes. The plasma generator 64 can generate a plasma (i) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF current at a power level of from about 750 Watts to about 2000 Watts can be applied to an inductor coil (not shown) to inductively couple energy into the deposition chamber to generate a plasma in the process zone 56. When an RF current is used, the frequency of the RF current is typically from about 400 KHz to about 16 MHZ, and more typically about 13.56 MHZ. Optionally, a gas containment or plasma focus ring (not shown), typically made of aluminum oxide or quartz, can be used to contain the flow of process gas or plasma around the substrate.

Figure 6:
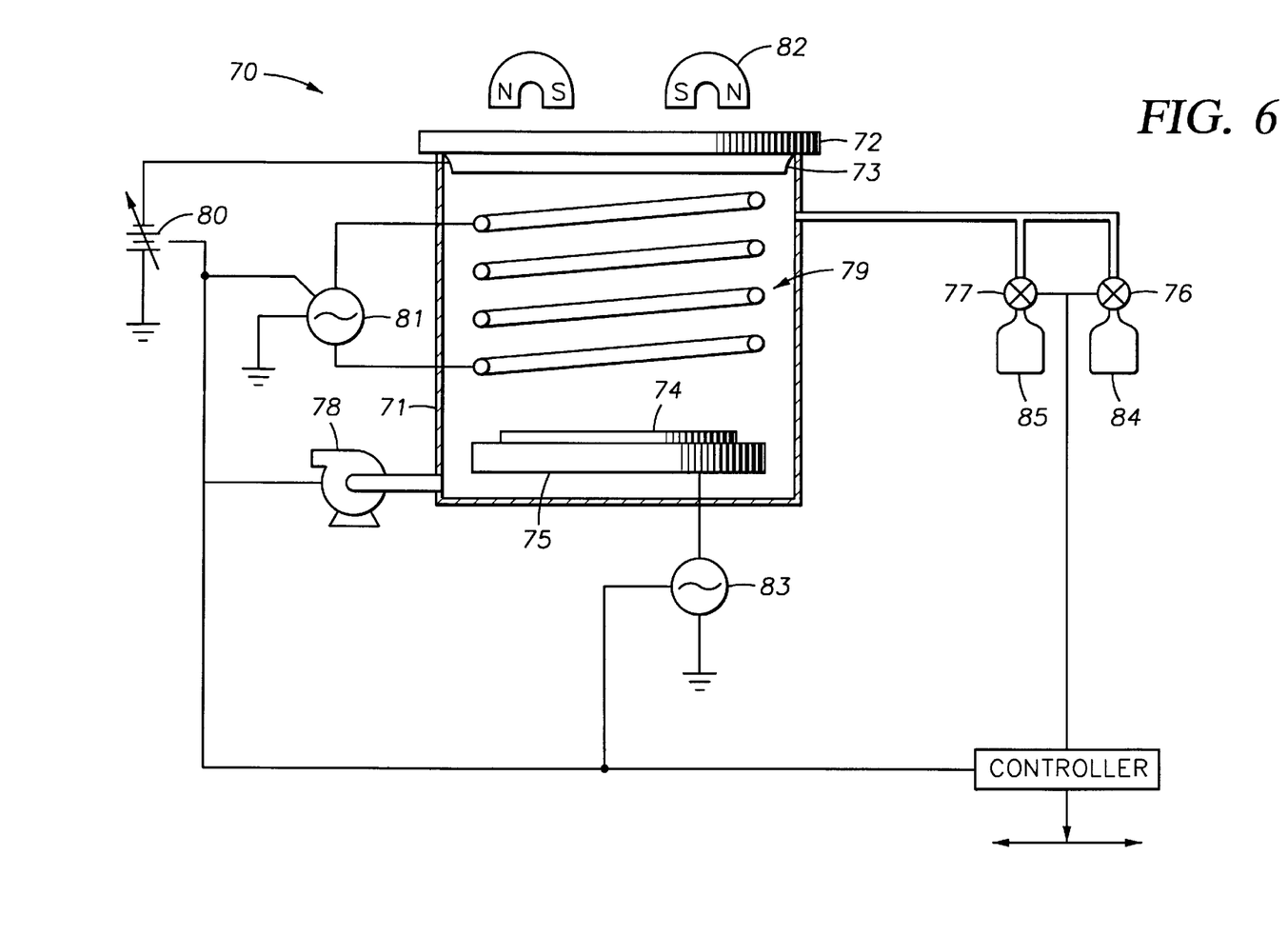
FIG. 6 is a schematic cross-sectional view of a PVD chamber suitable for performing a PVD processes of the present invention.

FIG. 6 is a schematic cross-sectional view of a PVD chamber 70 suitable for performing a PVD processes of the present invention. As shown in this figure, which is meant only to be schematical, a vacuum chamber is defined principally by a chamber wall 71 and a target backing plate 72. A PVD target 73 is attached to the target backing plate and has a composition comprising at least part of the material being sputter deposited. For the deposition of both titanium (Ti) and titanium nitride (TiN), the target 73 is made of titanium. A substrate 74 being sputter deposited with a layer of a PVD film is supported on a pedestal electrode 75 in opposition to the target 73. Processing gas is supplied to the chamber 70 from gas sources 84, 85 as metered by respective mass flow controllers 76, 77 and a vacuum pump system 78 maintains the chamber 70 at the desired low pressure.

An inductive coil 79 is wrapped around the space between the target 73 and the pedestal 75. Three independent power supplies are used in this type of inductively coupled sputtering chamber. A DC power supply 80 negatively biases the target 73 with respect to the pedestal 75. An RF power source 81 supplies electrical power in the megahertz range to the inductive coil 79. The DC voltage applied between the target 73 and the substrate 74 causes the processing gas supplied to the chamber to discharge and form a plasma. The RF coil power inductively coupled into the chamber 70 by the coil 79 increases the density of the plasma, that is, increases the density of ionized particles. Magnets 82 disposed behind the target 73 significantly increase the density of the plasma adjacent to the target 73 in order to increase the sputtering efficiency. Another RF power source 83 applies electrical power in the frequency range of 100 KHz to a few megahertz to the pedestal 75 in order to bias it with respect to the plasma.

Argon from the gas source 84 is the principal sputtering gas. It ionizes in the plasma, and its positively charged ions are attracted to the negatively biased target 73 with enough energy that the ions sputter particles from the target 73, that is, target atoms or multi-atom particles are dislodged from the target. The sputtered particles travel primarily along ballistic paths, and some of them strike the substrate 74 to deposit upon the substrate as a film of the target material. If the target 73 is titanium and assuming no further reactions, a titanium film is thus sputter deposited.

Before a material layer can be sputtered onto the workpiece 73, the workpiece is typically passed through a load lock (not shown) communicating with a slit valve (not shown) in the enclosure wall 84, and positioned within the chamber 70 by a robot arm, blade or other workpiece handling device (not shown) to be received on the support pedestal. In preparation for receiving a workpiece, the substrate support pedestal is lowered by a drive mechanism well below the clamp ring suspended on the shield so that the bottom of the pedestal is close to a pin positioning platform. The pedestal typically includes three or more vertical bores (not shown), each of which allows a vertically slidable pin to pass therethrough. When the pedestal is in the lowered position just described, the upper tip of each pin protrudes above the upper surface of the pedestal. The upper tips of the pins define a plane parallel to the upper surface of the pedestal.

Control Systems

The processes of the present invention can be implemented using a computer program product 141 that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 7:
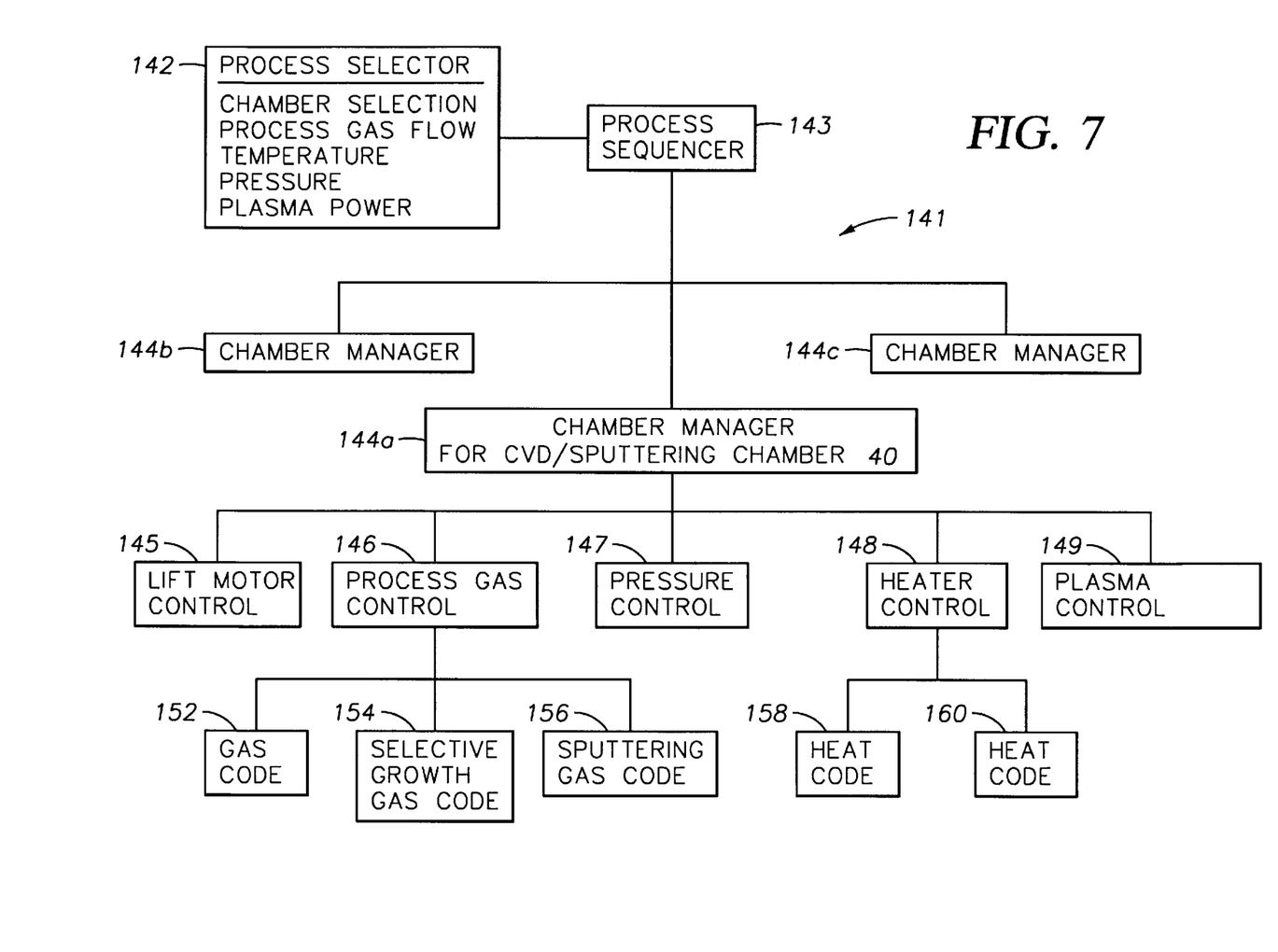
FIG. 7 is a simplified block diagram showing the hierarchical control structure of a computer program of the present invention.

FIG. 7 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process set the desired process chamber, and (ii) the desired set of process parameters needed to operate the process chamber for performing a particular process. The process parameters relate to process conditions such as, for example, process gas composition and flow rates, temperature, pressure, plasma conditions such as RF bias power levels and magnetic field power levels, cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (I) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to the chamber manager subroutines 144a–c which control multiple processing tasks in different process chambers according to the process set determined by the sequencer subroutine 143. For example, the chamber manager subroutine 144a comprises program code for controlling CVD process operations, within the described process chamber 40. The chamber manager subroutine 144 also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149. These different subroutines function as seeding program code means for (I) heating the substrate to temperatures $T_s$ within a range of temperatures $\Delta T_s$, and (ii) introducing a reaction gases into the process zone to deposit a substantially continuous insulating layer on the field portions of the substrate; and deposition growth program code means for (I) maintaining the substrate at a deposition temperatures $T_d$ within a range of temperature $\Delta T_d$, and (ii) introducing deposition gas into the process zone to form an epitaxial growth layer that is grown in the contact holes or vias. Those having ordinary skill in the art would readily recognize that other chamber control subroutines can be included depending on what processes are desired to be performed in the process chamber 40.

In operation, the chamber manager subroutine 144a selectively schedules or calls the process component subroutines in accordance within the particular process set being executed. The chamber manager subroutine 144a schedules the process component subroutines similarly to how the sequencer subroutine 143 schedules which process chamber 40 and process set is to be executed next. Typically, the chamber manager subroutine 144a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described. The substrate positioning code or subroutine 145 comprises program code for controlling chamber components that are used to load the substrate onto the chamber support 65, and optionally to lift the substrate to a desired height in the chamber 40 to control the spacing between the substrate and the gas distributor 55. When a substrate is loaded into the process chamber 40, the substrate support 65 is lowered to receive the substrate, and thereafter, the support is raised to the desired height in the chamber. The substrate positioning subroutine 145 controls movement of the support 65 in response to the process set parameters related to the support height that are transferred from the chamber manager subroutine 144a.

The process gas control subroutine 146 has program code for controlling process gas composition and flow rates. Generally, the process gases supply lines for each of the process gases, include (I) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine 146 controls the open/close portion of the safety shut-off valves, and also ramps up/down the mass flow controllers to obtain the desired gas flow rate. The process gas control subroutine 146 is invoked by the chamber manager subroutine 144a, as are all chamber component subroutines, and receives from the chamber manager subroutine process parameters related to the desired gas flow rates. Typically, the process gas control subroutine 146 operates by opening the gas supply lines, and repeatedly (I) reading the necessary mass flow controllers, (ii) comparing the readings to the desired flow rates received from the chamber manager subroutine 144a, and (iii) adjusting the flow rates of the gas supply lines as necessary. Furthermore, the process gas control subroutine 146 includes steps for monitoring the gas flow rates for unsafe rates, and activating the safety shut-off valves when an unsafe condition is detected.

The process gas control subroutine 146 comprises deposition via program code for operating the chamber in a preferential field growth mode or a selective growth mode. In the preferential field growth stage, the reactant gas program code 152 flows reactant gas into the chamber 40 for an amount of time necessary to form a thin insulating layer on the substrate. Thereafter, in the selective deposition growth stage, the deposition gas program code 154 flows deposition gas into the chamber 40 for an amount of time necessary to grow the desired selective growth layer on the contact holes or vias and on the field. Sputtering gas program code 156 can also be provided to introduce sputtering gas into the PVD chamber 36 during performance of the PVD process step.

The process gas can be formed from a gas or liquid precursor. When a process gas is vaporized from a liquid precursor, for example dimethyl aluminum hydride (DMAH), the process gas control subroutine 146 is written to include steps for bubbling a carrier gas such as hydrogen, argon, or helium, through the liquid precursor in a bubbler assembly. For this type of process, the process gas control subroutine 146 regulates the flow of the carrier gas, the pressure in the bubbler, and the bubbler temperature in order to obtain the desired process gas flow rates. As discussed above, the desired process gas flow rates are transferred to the process gas control subroutine 146 as process parameters. Furthermore, the process gas control subroutine 146 includes steps for obtaining the necessary carrier gas flow rate, bubbler pressure, and bubbler temperature for the desired process gas flow rate by accessing a stored table containing the necessary values for a given process gas flow rate. Once the necessary values are obtained, the carrier gas flow rate, bubbler pressure and bubbler temperature are monitored, compared to the necessary values, and adjusted pressure in the chamber 40 by regulating the size of the opening of the throttle valve in the exhaust system 115 of the chamber. The opening size of the throttle valve is set to control the chamber pressure to the desired level in relation to the total process gas flow, size of the process chamber, and pumping setpoint pressure for exhaust system 115.

When the pressure control subroutine 147 is invoked, the desired or target pressure level is received as a parameter from the chamber manager subroutine 144a. The pressure control subroutine 147 operates to measure the pressure in the chamber 40 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 147 can be written to open or close the throttle valve to a particular opening size to regulate the chamber 40 at the desired pressure. The heater control subroutine 148 comprises program code for controlling the temperature of the heater 80 used to heat the substrate. The heater control subroutine 148 includes seeding stage heating program code 158 for operating in a seeding stage in which the substrate is maintained at a desired seeding temperatures $T_s$ within the range of temperatures $\Delta T_s$. Typically, the subroutine 148 is programmed to ramp up the temperature of the support from ambient chamber temperatures to a set point temperature. When the substrate reaches the seeding temperatures $T_s$, the process gas control subroutine 146 is programmed to introduce seeding gas into the chamber, as described above. The heater control subroutine 148 also comprises epitaxial growth heating program code 160 for rapidly heating the substrate to deposition temperatures $T_d$ within a range of temperatures $\Delta T_D$ that are suitable for growing an epitaxial growth layer on the seeding layer. In this step, the heater control subroutine 148 is invoked by the chamber manager subroutine 144a and receives a ramp rate temperature parameter of at least about 50° C./min.

The heater control subroutine 148 measures temperature by measuring voltage output of a thermocouple located in the support, compares the measured temperature to the setpoint temperature, and increases or decreases current applied to the heater 80 to obtain the desired ramp rate or setpoint temperature. The temperature is obtained from the measured voltage by looking up the corresponding temperature in a stored conversion table, or by calculating the temperature using a fourth order polynomial. When radiant lamps are used as the heater 80, the heater control subroutine 148 gradually controls a ramp up/down of current applied to the lamp that increases the life and reliability of the lamp. Additionally, a built-in fail-safe mode can be included to detect process safety compliance, and to shut down operation of the heater 80 if the process chamber 40 is not properly set up.

The plasma control subroutine 149 comprises program code for forming a deposition plasma in the chamber during operation of the chamber in a chemical vapor deposition mode. The subroutine 149 sets the RF bias voltage power level applied to the process electrodes 60, 65 in the chamber 40, and optionally sets the level of the magnetic field generated in the chamber, to form the deposition plasma. Similar to the previously described chamber component subroutines, the plasma control subroutine 149 is invoked by the chamber manager subroutine 144a. In operation, the plasma condition 149 includes steps for reading both "forward" power applied to the plasma generator 116, and "reflected" power flowing through the chamber 40. An excessively high reflected power reading indicates that the plasma has not been ignited, and the plasma control subroutine 149 restarts or shuts down the process. The read power levels are compared against target levels, and the current is adjusted to control the plasma for applying a sinusoidal wave current to the generator to form a rotating magnetic field in the chamber 40. The sinusoidal wave needed to generate a desired magnetic field can be obtained from a stored table of sinusoidal values corresponding to magnetic field strengths, or calculated using a sinusoidal equation.

While the foregoing is directed to the preferred embodiment of the present invention, other and further embodiments of the invention may be devised without departing from the basic scope thereof. The scope of the invention is determined by the claims which follow.

We claim:

1. A method of processing a substrate, comprising:
   (a) exposing a silicon surface to a nitrogen plasma to form a silicon nitride layer;
   (b) depositing a titanium layer;
   (c) exposing the titanium layer to nitrogen to form a titanium nitride layer; and
   (d) depositing an aluminum layer on the titanium nitride layer.

2. The method of claim 1, further comprising:
   repeating steps (b) and (c) before performing step (d).

3. The method of claim 1, wherein the titanium layer is deposited using a high density plasma.

4. The method of claim 1, wherein the titanium nitride layer is discontinuous.

5. The method of claim 1, wherein the titanium nitride layer is continuous.

6. The method of claim 1, wherein exposing the titanium layer to nitrogen comprises striking a nitrogen plasma.

7. The method of claim 6, wherein striking a nitrogen plasma comprises capacitively or inductively coupling energy into a process zone adjacent the substrate in the presence of nitrogen.

8. The method of claim 1, wherein the titanium nitride layer nucleates the deposition of the aluminum layer.

9. The method of claim 1, wherein the titanium nitride layer is a subatomic layer.

10. The method of claim 1, wherein the nitrogen flows into a process zone adjacent the substrate at a rate between about 5 sccm and about 500 sccm.

11. The method of claim 1, further comprising:
   (e) heating the aluminum to a temperature between about 400° C. and about 600° C.

12. The method of claim 1, further comprising:
   (e) annealing the aluminum at a temperature between about 450° C. and about 550° C.

13. The method of claim 12, wherein the sheet resistance of the annealed aluminum in less than about 0.39 Ohms.

14. A method of processing a substrate, comprising:
   (a) exposing a silicon surface to a nitrogen plasma at a pressure from about 0.5 mTorr to about 5 Torr to form a silicon nitride layer adjacent the silicon surface;
   (b) depositing a titanium layer;
   (c) contacting the titanium layer with nitrogen to form a titanium nitride layer adjacent the titanium layer;
   (d) depositing a first layer of aluminum on the titanium nitride layer; and (e) depositing a second layer of PVD warm aluminum over the first layer of aluminum.

15. The method of claim 14, wherein the titanium layer is deposited by physical vapor deposition.

16. The method of claim 14, further comprising:

repeating steps (b) and (c) before performing steps (d) and (e).

17. The method of claim 14, further comprising:

(f) depositing titanium nitride on the aluminum.

18. A method of processing a substrate, comprising:

(a) depositing a titanium layer on the substrate;

(b) contacting the titanium layer with nitrogen to form a titanium nitride layer adjacent to the titanium layer;

(c) depositing a nucleation material on the titanium nitride layer;

(d) depositing a wetting layer over on the nucleation material; and (e) depositing a PVD aluminum layer on the wetting layer.

19. The method of claim 18, wherein the titanium layer is deposited by physical vapor deposition.

20. The method of claim 18, wherein the nucleation material is PVD aluminum and the wetting layer is CVD aluminum.

21. A method of processing a substrate having a silicon surface, comprising:

(a) exposing the silicon to a nitrogen plasma at a pressure from about 0.5 mTorr to about 5 Torr;

(b) depositing a titanium layer on the substrate;

(c) contacting the titanium layer with nitrogen to form a titanium nitride layer adjacent to the titanium layer; and (d) depositing a first layer of aluminum on the titanium nitride layer; whereby interaction of the first layer of aluminum with the silicon and the titanium layer is substantially prevented.

22. The method of claim 21, wherein steps (a)–(c) are performed in a high density plasma physical vapor deposition chamber.

23. The method of claim 22, further comprising:

(e) depositing a second layer of PVD warm aluminum over the first layer of aluminum.

24. A method of processing a substrate having exposed titanium and silicon, comprising:

(a) providing nitrogen to a process zone adjacent the substrate at a pressure between about 0.5 mTorr and about 5 Torr; and (b) striking a plasma in the process zone;

(c) converting a portion of the exposed titanium to titanium nitride; and (d) converting a portion of the exposed silicon to silicon nitride.

25. The method of claim 24, wherein striking a plasma comprises capacitively or inductively coupling energy into the process zone.

26. The method of claim 24, wherein the nitrogen is provided into the process zone at a rate between about 5 sccm and about 500 sccm.

27. The method of claim 1 wherein the substrate is at a temperature between about 20° C. and about 400° C. while exposing the titanium layer to nitrogen.

28. The method of claim 14 wherein the substrate is at a temperature between about 20° C. and about 400° C. while contacting the titanium layer on the substrate with nitrogen.

* * * * *

UNITED STATES PATENT AND TRADEMARK OFFICE
CERTIFICATE OF CORRECTION

PATENT NO. : 6,080,665  
DATED : June 27, 2000  
INVENTOR(S) : Chen et al.

Page 1 of 1

It is certified that error appears in the above-identified patent and that said Letters Patent is hereby corrected as shown below:

Title page,
References Cited, -- 4,784,973   11/1988   Stevens et al. --; and -- 5,633,199   11/1995   Fiordalice et al. --.

OTHER PUBLICATIONS,
Please insert -- Formation of Titanium Nitride Layers by the Nitridation of Titanium in High-Pressure Ammonium Ambient, Tohru Hara, Kouichi Tani, and Ken Inoue, Applied Physics Letters 57, 15 October 1990, No. 16, New York --.

Column 3,
Line 45, please delete "$\mu\Omega s9$", and insert -- $\mu\Omega/sq$ --.

Signed and Sealed this

Eighteenth Day of December, 2001

Attest:

Attesting Officer

JAMES E. ROGAN
*Director of the United States Patent and Trademark Office*